(12) United States Patent
Dorenkamp et al.

(10) Patent No.: US 7,813,143 B2
(45) Date of Patent: Oct. 12, 2010

(54) CONVERSION MODULE AND CHASSIS ARRANGEMENT, AND RELATED METHODS

(75) Inventors: James Dorenkamp, Shakopee, MN (US); Vern Loch, Prior Lake, MN (US); Jeffrey Peters, Eagan, MN (US); Wayne Nelson, Hudson, WI (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 1531 days.

(21) Appl. No.: 11/107,341

(22) Filed: Apr. 15, 2005

(65) Prior Publication Data

US 2006/0234782 A1    Oct. 19, 2006

(51) Int. Cl.
H05K 7/10    (2006.01)
(52) U.S. Cl. .................. 361/797; 361/796; 361/729; 174/520
(58) Field of Classification Search ............. 361/788, 361/796, 729, 797; 710/300, 301; 174/520
See application file for complete search history.

(56) References Cited

U.S. PATENT DOCUMENTS

| | | | |
|---|---|---|---|
| 5,010,450 A | | 4/1991 | Werdin et al. |
| 5,196,712 A | * | 3/1993 | Nguyen et al. ............. 250/551 |
| 5,398,161 A | * | 3/1995 | Roy ............................ 361/727 |
| 5,412,751 A | | 5/1995 | Siemon et al. |
| 5,912,801 A | * | 6/1999 | Roy et al. ................... 361/690 |
| 6,144,561 A | * | 11/2000 | Cannella et al. ........... 361/796 |
| 6,167,183 A | | 12/2000 | Swain |
| 6,343,007 B1 | * | 1/2002 | Dubois et al. ............. 312/223.2 |
| 6,411,520 B1 | | 6/2002 | Hauke et al. |
| 6,556,763 B1 | | 4/2003 | Puetz et al. |
| 6,637,845 B2 | | 10/2003 | Berg, Jr. et al. |
| 6,822,874 B1 | | 11/2004 | Marler |
| 6,824,312 B2 | | 11/2004 | McClellan et al. |
| 2002/0132576 A1 | | 9/2002 | Sit et al. |
| 2002/0173278 A1 | | 11/2002 | Fritz et al. |
| 2003/0103335 A1 | | 6/2003 | Skradde et al. |
| 2005/0122701 A1 | | 6/2005 | Coffey |

FOREIGN PATENT DOCUMENTS

WO    WO 99/41903    8/1999

OTHER PUBLICATIONS

"7700FR-C, 7701FR & S7701FR Evertz 7700 Series Multifames," http://www.evertz.com/products/7700FR.php, 3 pages (publicly known prior to the filing date of the present application).

(Continued)

*Primary Examiner*—Dameon E Levi
(74) *Attorney, Agent, or Firm*—Merchant & Gould P.C.

(57) ABSTRACT

A telecommunications arrangement including a chassis, at least one power supply, and a plurality of conversion modules that provide an electrical-to-optical or optical-to-electrical signal conversion. The chassis includes a separate back plane made up of individual back panels. The back panels are attached to the chassis by a tab and swell latch. The conversion modules include a printed circuit board, an input/output arrangement of connectors, and a radius limiter mounted to the printed circuit board.

25 Claims, 12 Drawing Sheets

OTHER PUBLICATIONS

"7705EO-HD HDTV Electrical to Optical Converter, 19.4Mb/s to 1.5Gb/s," http://www.evertz.com/products/7705EO-HD.php, 3 pages (publicly known prior to the filing date of the present application).

7705EO-HD HDTV Optical to Electrical Converter, 19.4Mb/s to 1.5Gb/s, http://www.evertz.com/products/7705OE-HD.php, 2 pages (publicly known prior to the filing date of the present application).

"nVision® Synapse Modular Broadcast System," pp. 1-116 (publicly known prior to the filing date of the present application).

* cited by examiner

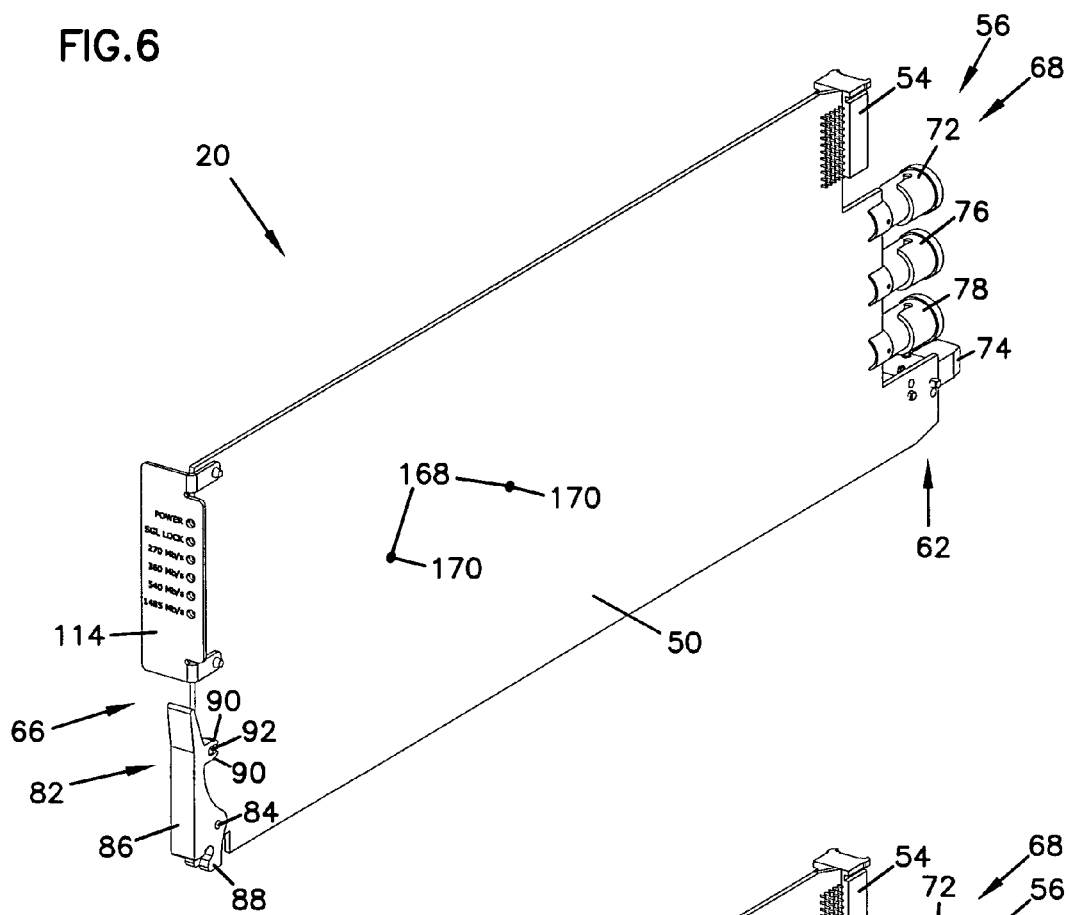
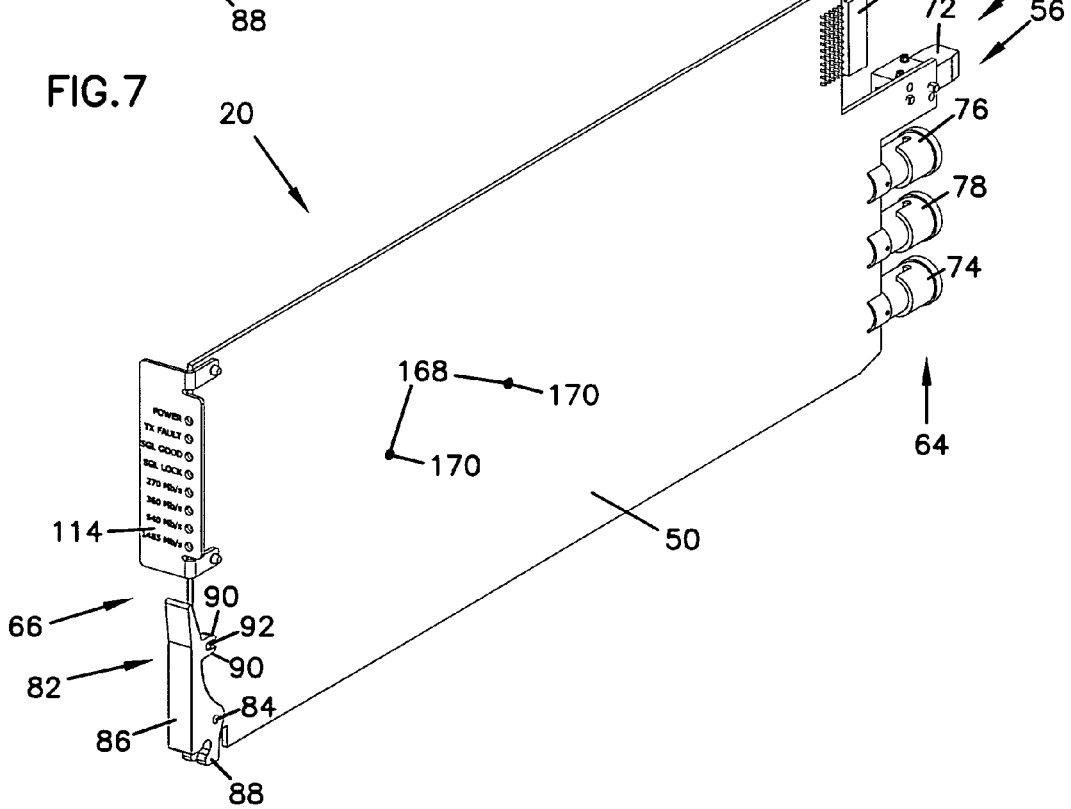

FIG.8
FIG.9
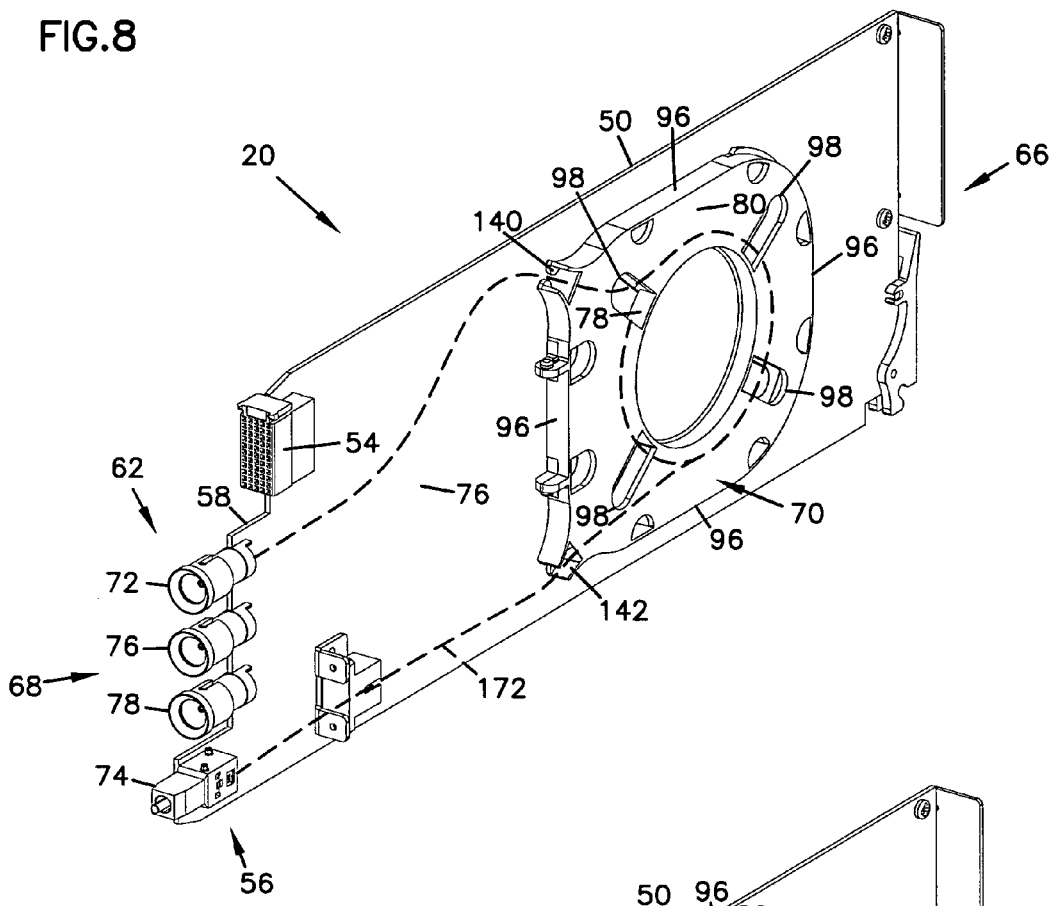
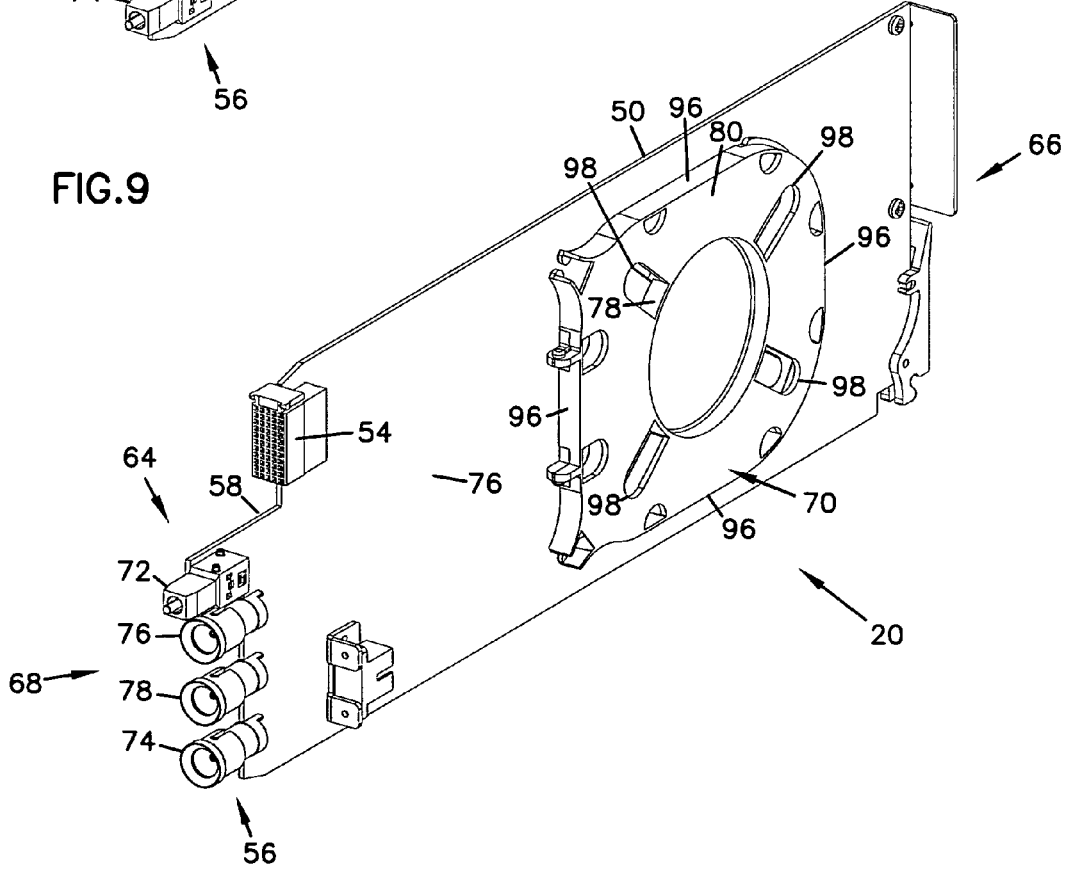

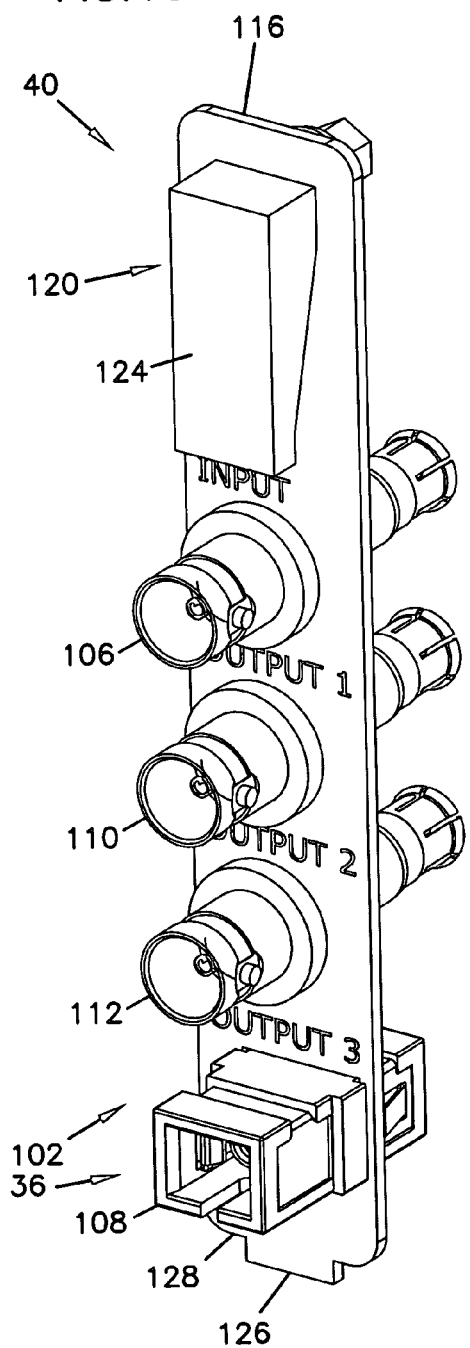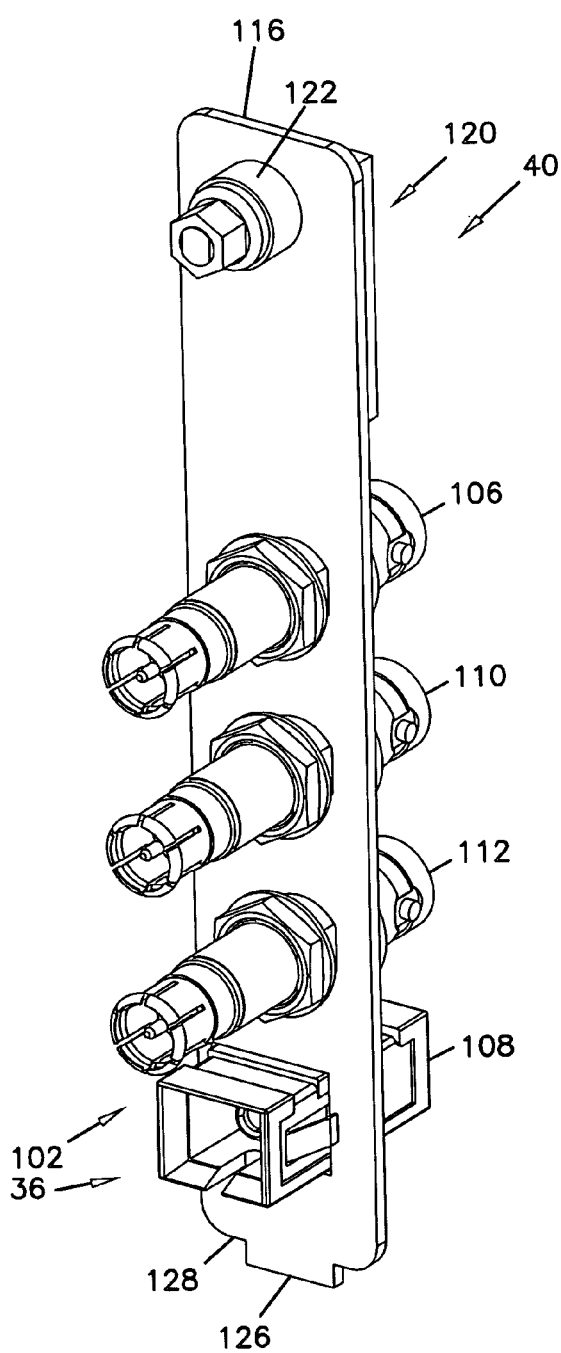

FIG.12
FIG.13
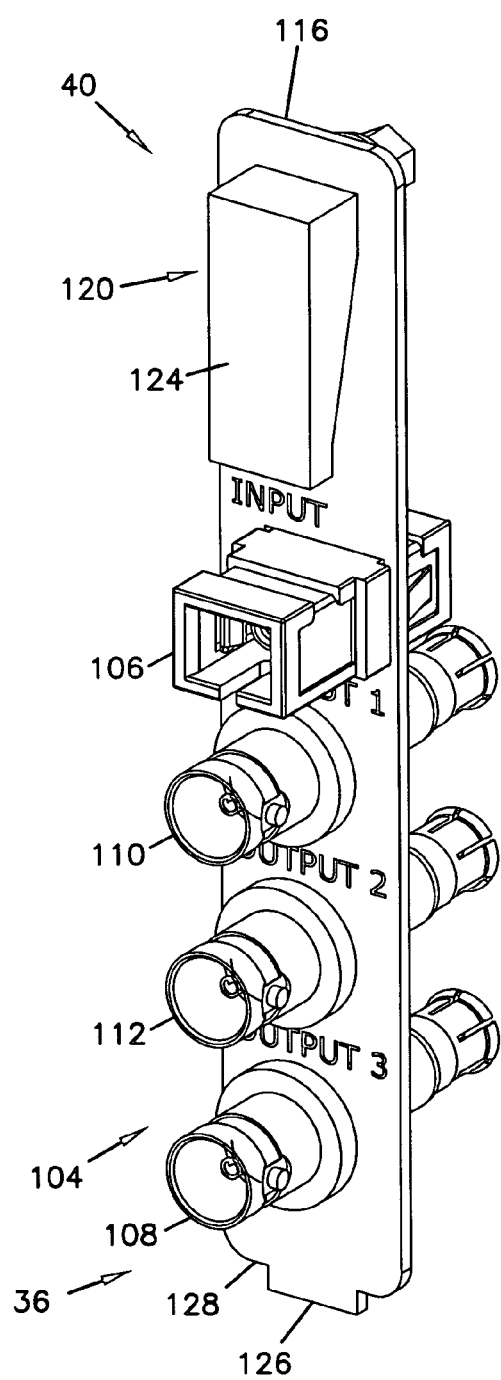
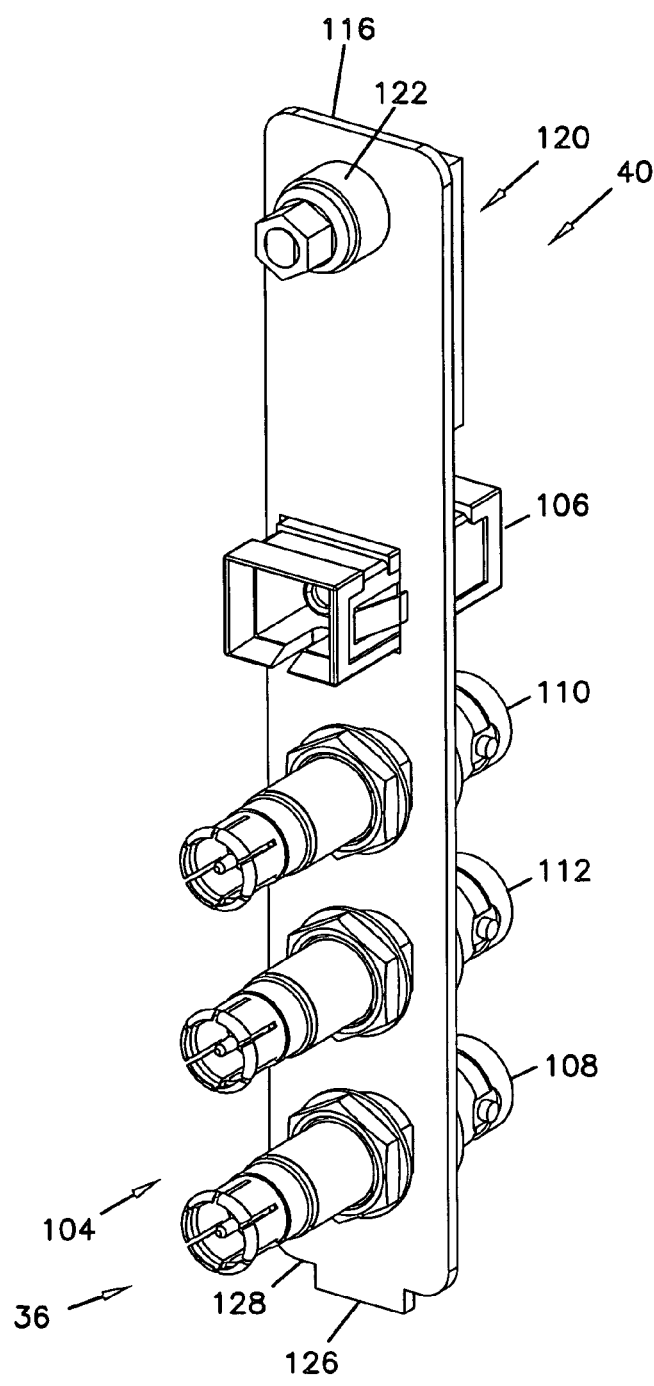

CONVERSION MODULE AND CHASSIS ARRANGEMENT, AND RELATED METHODS

TECHNICAL FIELD

This disclosure relates generally to telecommunications equipment. More specifically, this disclosure relates to an arrangement and devices concerning electrical-to-optical and optical-to-electrical signal conversion.

BACKGROUND

Telecommunications equipment for converting electrical signals to optical signals and for converting optical signals to electrical signals is useful in various applications. For example, electrical-to-optical and optical-to-electrical converters are useful in applications, such as high-definition television (HDTV) applications, where signals arrive in electrical media but must be transmitted or distributed over distances greater than is possible with a continuous electrical conductor. Electrical conductors can carry signals over only relatively limited distances due to signal attenuation. In contrast, fiber optic conductors can carry signals over distances many times greater than electrical conductors. Electrical signals, however, are easier to manipulate for media purposes than optical signals. Therefore, it is common to apply an electrical-to-optical conversion to a signal prior to distribution or long-distance transmission, and then apply an optical-to-electrical conversion near the destination.

In general, improvement has been sought with respect to such conversion systems and arrangements, generally to: increase electrical-to-optical and optical-to-electrical conversion capacity, better accommodate adaptability for varying applications, and improve and ease repair and maintenance methods.

SUMMARY

One aspect of the present invention relates to a telecommunications arrangement including a chassis, first and second power supplies vertically stacked relative to one another, and a plurality of upright conversion modules. A first number of conversion modules are located on one side of the stacked power supplies, and a second number of conversion modules are located on the other side of the stacked power supplies.

Another aspect of the present invention relates to a telecommunications arrangement including a chassis, at least one power supply, and at least sixteen conversion modules positioned within a front opening of the chassis. The conversion modules each include a printed circuit board, an input and an output, and circuitry for converting an electrical signal to an optical signal, or an optical signal to an electrical signal.

Still another aspect of the present invention relates to a conversion module including a printed circuit board, an input connector and an output connector, a cable interconnected between the input connector and the output connector, and a radius limiter mounted to the printed circuit board.

Yet another aspect of the present invention relates to a chassis having a top wall and a bottom wall. The chassis includes a number of card guides located on the top and bottom walls and a plurality of individual back panels. Each of the back panels includes a tab sized to fit within a slot formed in the bottom wall of the chassis, and a swell latch arranged to engage a hole formed in the top wall of the chassis.

Another aspect of the present invention relates to back panel for use with a conversion arrangement. The back panel includes a panel structure with an input and an output connector mounted to the panel structure. The panel also includes a swell latch located adjacent to a top edge of the panel structure and a tab extending from the bottom edge of the panel structure.

A variety of examples of desirable product features or methods are set forth in part in the description that follows, and in part will be apparent from the description, or may be learned by practicing various aspects of the disclosure. The aspects of the disclosure may relate to individual features as well as combinations of features. It is to be understood that both the foregoing general description and the following detailed description are explanatory only, and are not restrictive of the claimed invention.

BRIEF DESCRIPTION OF THE DRAWINGS

FIG. 6 is a front perspective view of one embodiment of a conversion module shown in the telecommunications arrangement of FIG. 1;

FIG. 7 is a front perspective view of another embodiment of a conversion module shown in the telecommunications arrangement of FIG. 1;

FIG. 8 is a rear perspective view of the conversion module of FIG. 6;

FIG. 9 is a rear perspective view of the conversion module of FIG. 7;

FIG. 10 is a rear perspective view of one embodiment of a back panel shown in the telecommunications arrangement of FIG. 4;

FIG. 11 is a front perspective view of the back panel of FIG. 10;

FIG. 12 is a rear perspective view of another embodiment of a back panel shown in the telecommunications arrangement of FIG. 4;

FIG. 13 is a front perspective view of the back panel of FIG. 12;

DETAILED DESCRIPTION

Reference will now be made in detail to various features of the present disclosure that are illustrated in the accompanying drawings. Wherever possible, the same reference numbers will be used throughout the drawings to refer to the same or like parts.

FIGS. 1-17 illustrate a telecommunications arrangement 10 having features that are examples of how inventive aspects in accordance with the principles of the present disclosure may be practiced. Preferred features are adapted for use in HDTV applications, for example. However, the features can be used in accordance with the principles disclosed in other audio and visual applications. The disclosed telecommunications arrangement 10 is configured to convert an incoming electrical signal into an outgoing optical signal, or to convert an incoming optical signal into an outgoing electrical signal. The disclosed arrangement promotes cable management and ease of maintenance or assembly, and provides an enhanced conversion capacity as compared to conventional arrangements.

Figure 2:
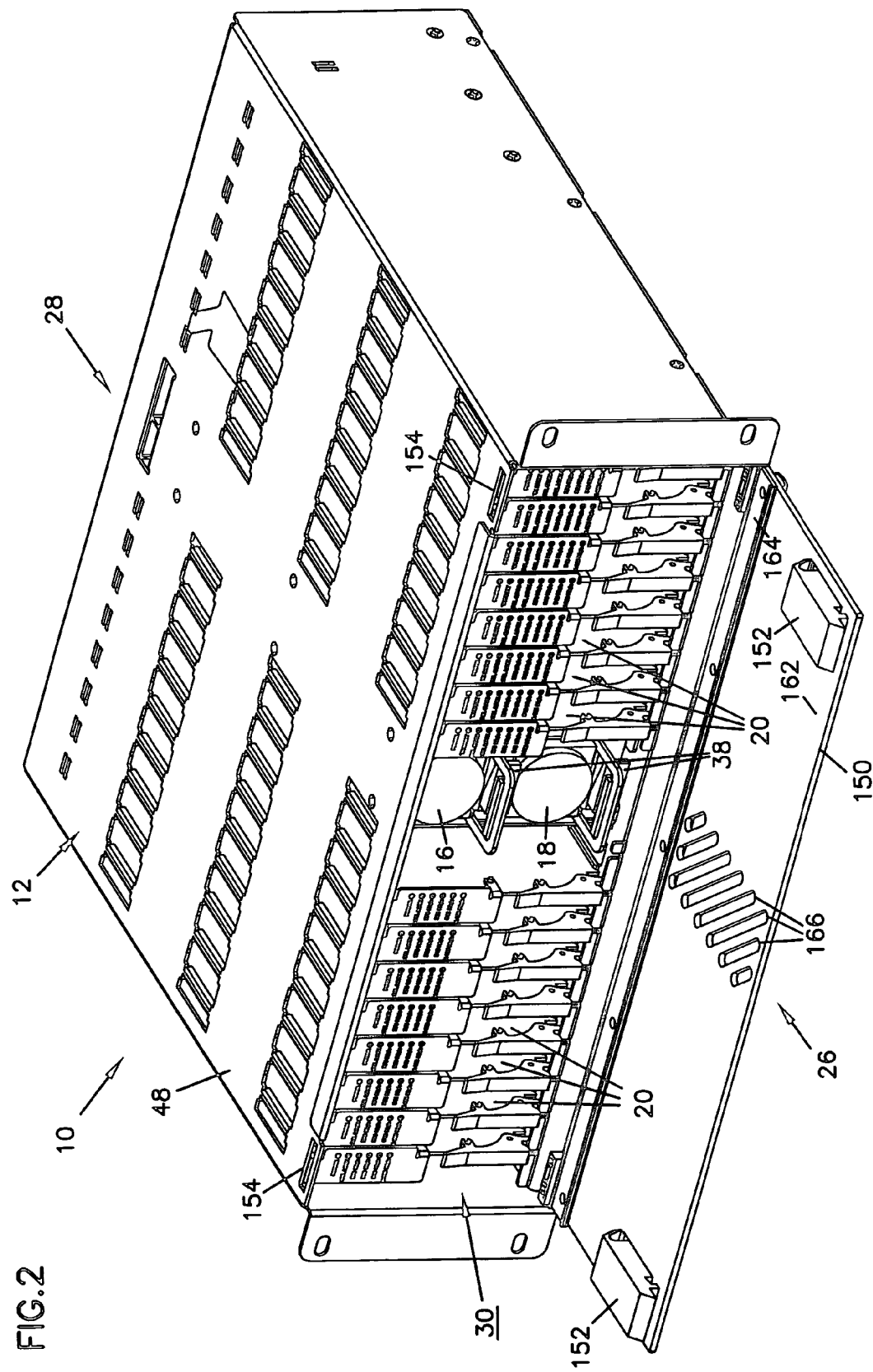
FIG. 2 is another front perspective view of the telecommunications arrangement of FIG. 1, shown with an open front cover.

Referring now to FIG. 2, the telecommunications arrangement 10 generally includes a chassis 12. The chassis 12 is configured to receive a CPU module 14 (FIGS. 3 and 5), at least one power source or power supply 16, 18, and a plurality of conversion modules or cards 20.

As can be understood, circuit or conversion capacity of telecommunications equipment is becoming increasingly important in industry today. Conventional arrangements typically provide at most only fourteen conversion cards. In the present arrangement 10 is designed to provide a user with sixteen conversion cards or modules 20. The present arrangement thereby provides an increased electrical-to-optical and optical-to-electrical conversion capacity, which can then be applied to and adapted for use in a greater number of varying applications.

Figure 3:
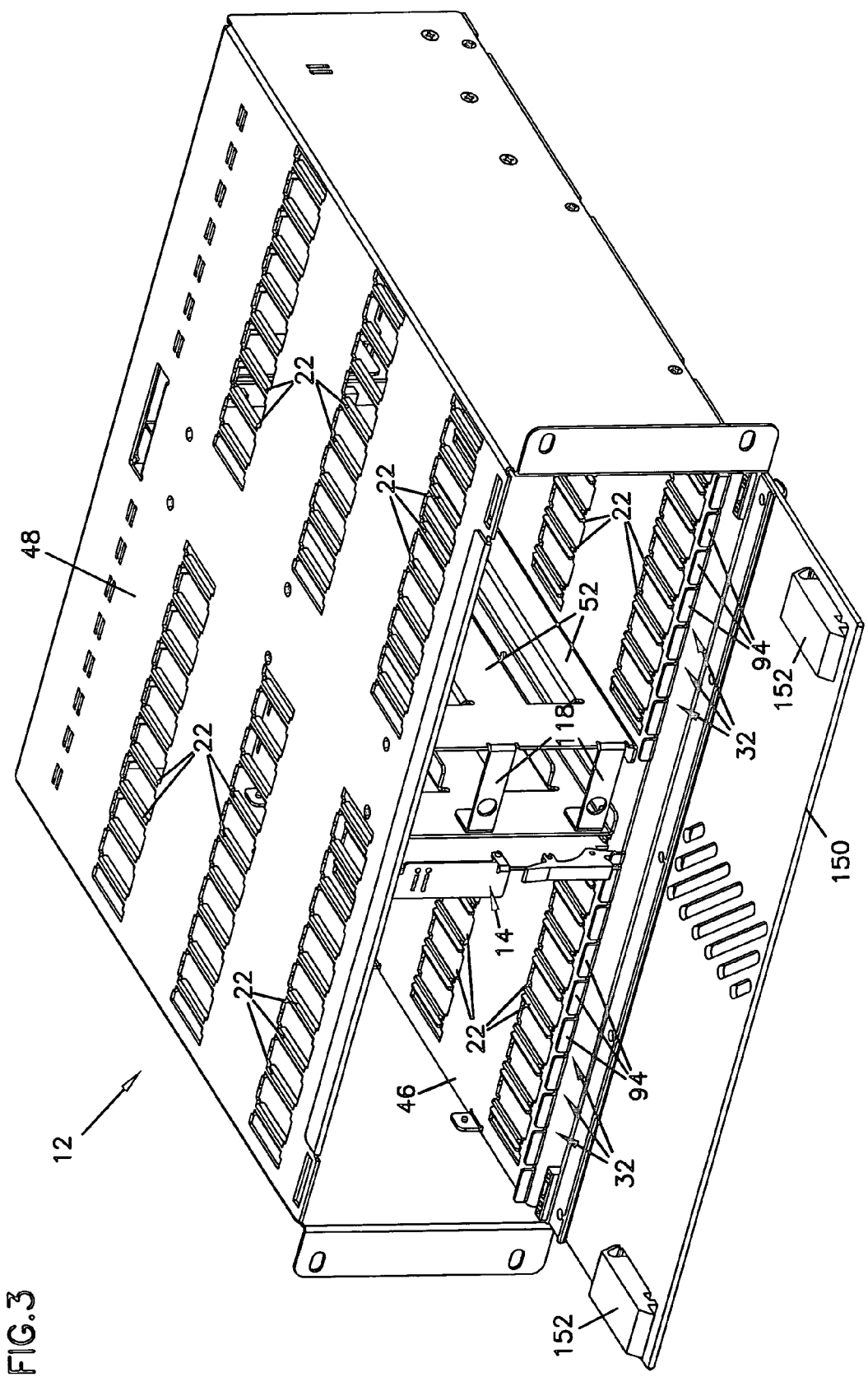
FIG. 3 is front perspective view of a chassis of the telecommunications arrangement of FIG. 2, shown with a CPU module, and shown without conversion modules or power supplies.

Still referring to FIG. 2, the chassis 12 of the present disclosure has a front 26 and a rear 28. The front 26 defines a front opening 30. The plurality of conversion modules 20 is positionable within the front opening 30. As shown in FIG. 3, the front opening 30 of the chassis 12 defines a number of slots or slot compartments 32 that extend into the chassis 12. Each of the slot compartments 32 is sized to receive one of the conversion modules 20.

Card guide structure 22 is located on both bottom and top walls 46, 48 of the chassis 12. The card guide structure 22 at least partially defines the slot compartments 32 and assists in properly locating each of the conversion modules 20 within a respective slot compartment 32. In general, the conversion modules are inserted into the chassis 12 from the front 26 of the chassis 12 toward the rear 28. More specifically, each of the conversion modules 20 is installed or positioned within the chassis 12 by sliding the conversion module 20, in an upright orientation, into one of the slot compartments 32. What is meant by upright is that the conversion modules 20 are oriented such that when viewed from the front 26 of the chassis 12, the modules 20 are vertically oriented as opposed to horizontally oriented.

Referring back to FIG. 1, in general, the chassis 12 has an overall width W1, an overall height H1, and an overall length L1, although the disclosed principles can be applied in a variety of sizes and applications. The width W1 of the chassis 12 is generally defined as the distance between mounting holes 174 formed in flanges 24 attached to sidewalls 42, 44 of the chassis. The width W1 is preferably about 19 inches. The height H1 of the chassis 12 is generally defined between the bottom wall 46 and the top wall 48 of the chassis 12, and is preferably about 5.2 inches. The length L1 of the chassis 12 extends from the front 26 to the rear 28 of the chassis 12 and is preferably about 15 inches.

Referring again to FIG. 2, the telecommunications arrangement 10 of the present disclosure includes first and second power sources or supplies 16, 18 positionable within the chassis 12. One exemplary type of power supply that can be used in the present arrangement includes a power supply pack manufactured by Deltron of North Wales, Pa.

Figure 4:
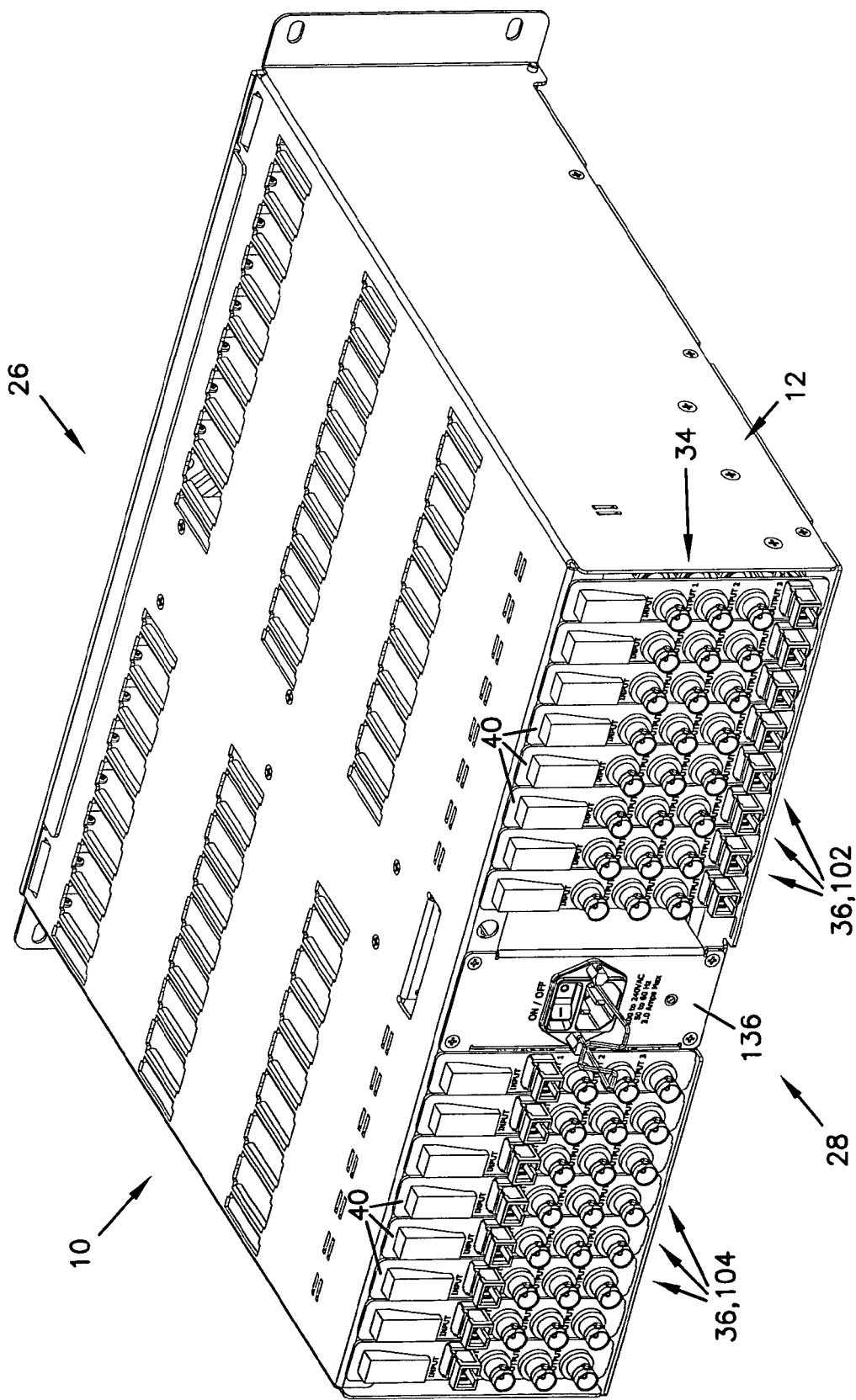
FIG. 4 is rear perspective view of the telecommunications arrangement of FIG. 1.

In operation, one of the first and second power supplies, e.g., the first power supply 16, is used as the primary power source. The second power supply, e.g., 18, functions as a backup or redundant source in the event of a failure of the first power source. To install or position each of the power supplies 16, 18 within the chassis 12, the power supply is inserted into the chassis 12 from the front 26 of the chassis 12 toward the rear 28. In particular, the power supplies 16, 18 are positioned within support channels 52 (FIGS. 3 and 17) provided within the chassis 12. A latch, such as a swell latch 38, of each of the power supplies 16, 18 is used to secure the power supplies 16, 18 to brackets 118 (FIG. 3) attached to each of the support channels 52. As shown in FIG. 4, a back plate 136 is fastened to the rear side 28 of the chassis 12 to enclose the power supplies 16, 18 within the support channels 52.

Still referring to FIGS. 2 and 3, in the illustrated embodiment, the support channels 52 and the first and second power supplies 16, 18 are generally located at the center of the chassis 12. That is, the power supplies 16, 18 are located such that a number of upright conversion modules 20 are laterally located on each side of the power supplies 16, 18.

For example, eight conversion modules 20 are located on each side of the first and second power supplies 16, 18. The support channels 52 (FIG. 3) are arranged in a top-and-bottom array so that the first and second power supplies 16, 18 are vertically stacked relative to one another within the chassis 12. Placing the support channels 52 and the first and second power supplies 16, 18 within the middle or center of the chassis 12 provides structural support to the overall chassis structure. In conventional arrangements, power supplies are typically located off to one side of the chassis. In the illustrated embodiment, central placement of the power sources 16, 18 within the chassis 12 provides a more rigid chassis construction and a chassis that is also more structurally balanced.

Figure 17:
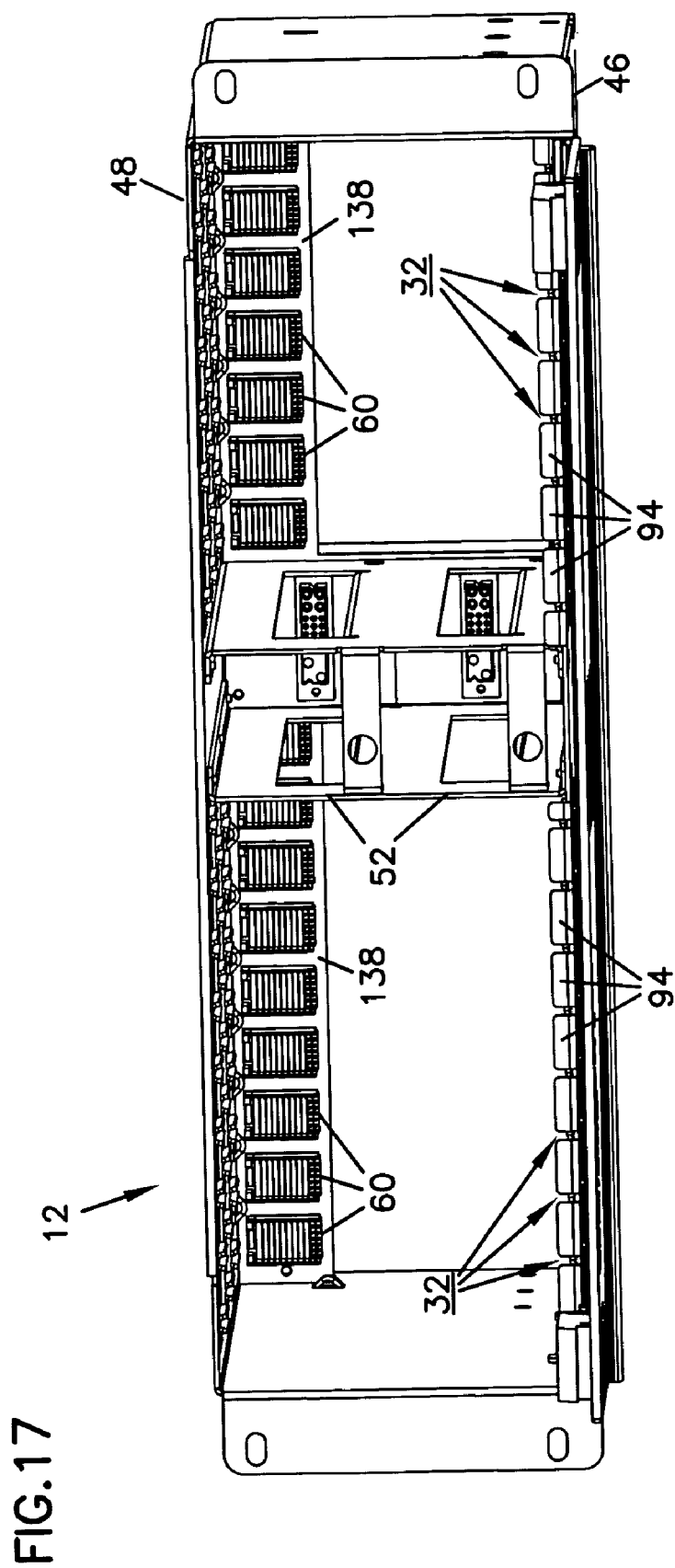
FIG. 17 is another front perspective view of the chassis of the telecommunications arrangement of FIG. 3, shown without the CPU module.

Referring now to FIG. 17, a plurality of power supply connectors 60 is located within the chassis 12 adjacent to the rear 28 of the chassis 12. Each of the power supply connectors 60 is electrically connected to the power supplies 16, 18 via an intermediate circuit board 138. The power supply connectors 60 transfer power from the power supplies 16, 18 to the conversion modules 20. Each of the power supply connectors 60 is also electrically connected to the CPU module 14 (FIGS. 3 and 5) via the intermediate circuit board 138. Accordingly, the power supply connectors 60 also provide electrical communication between the CPU module 14 and the conversion modules 20.

Referring now to FIGS. 6 and 7, each of the conversion modules 20 includes a printed circuit board 50 and a printed circuit board connector 54 that couples to one of the power supply connectors 60 (FIG. 17). Each printed circuit board 50 also includes an input/output (I/O) arrangement 56. In the embodiment shown in FIG. 6, the I/O arrangement 56 is an electrical-to-optical arrangement 62. In the embodiment shown in FIG. 7, the I/O arrangement 56 is an optical-to-electrical arrangement 64. Other I/O arrangements, such as an optical-to-optical arrangement or an electrical-to-electrical arrangement, are contemplated.

The telecommunications arrangement 10 can include a population of modules 20 having only electrical-to-optical arrangements 62, only optical-to-electrical arrangement 64, or a combination of both electrical-to-optical and optical-to-electrical arrangements 62, 64. The illustrated embodiment of the telecommunications arrangement 10 includes modules 20 having both electrical-to-optical and optical-to-electrical arrangements 62, 64.

Each of the electrical-to-optical and optical-to-electrical arrangements 62, 64 includes an input connector 72 and a primary output connector 74. Depending upon the type of I/O arrangement 56, the input connector 72 can include a coaxial connector or other electrical type connector, for example; or an SC optical connector, or other optical type connector. In the embodiment shown in FIGS. 7 and 9, the input connector is an SC connector having the grip portion of the SC connector mounted directly to the circuit board. The output connectors 74 of the modules 20 can include similar types of electrical or optical connectors.

In use, incoming signals are received by the input connectors 72 of the conversion modules 20. Within the conversion modules 20, the incoming signals are converted into either optical or electrical outgoing signals. The outgoing signals are transmitted from the conversion modules 20 through the output connectors 74. Voltage for powering the conversion modules 20 is provided by the primary power supply 16, which is electrically interconnected via the mating power supply connectors 60 (FIG. 17) and the printed circuit board connectors 54.

Figure 15:
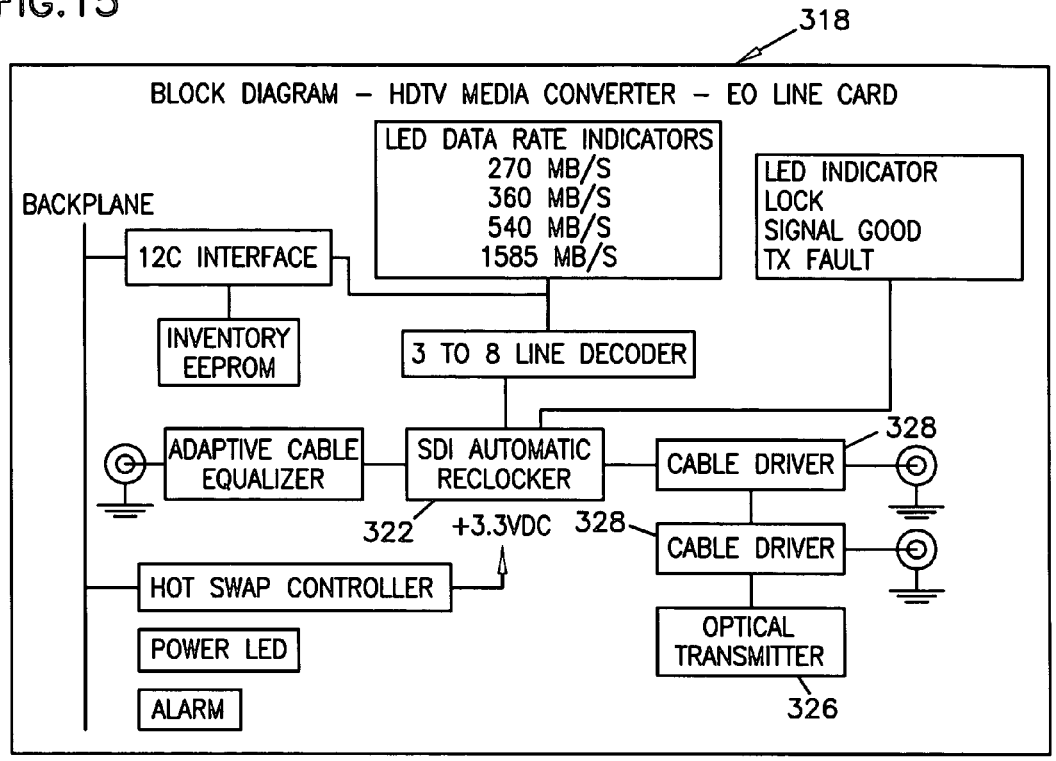
FIG. 15 is a schematic block diagram of circuitry provided by the conversion module of FIG. 7.
Figure 16:
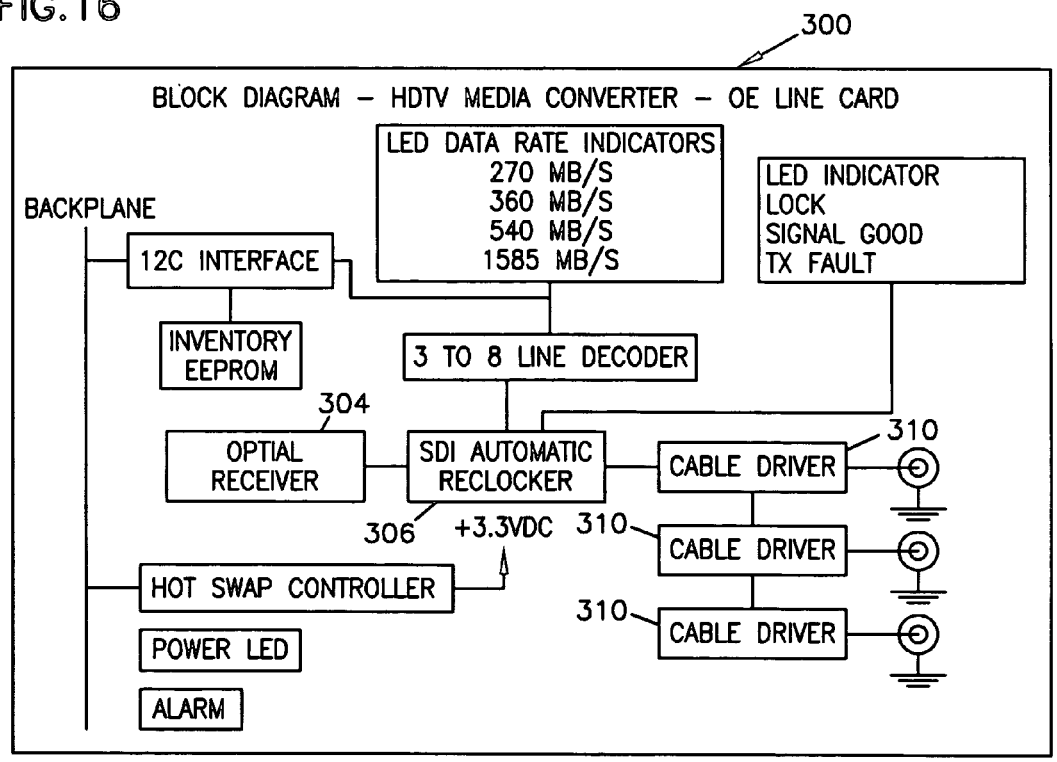
FIG. 16 is a schematic block diagram of circuitry provided by the conversion module of FIG. 6.

Referring now to FIGS. 15 and 16, a high-level block diagram of the conversion circuitry provided on the printed circuit boards 50 of the modules 20 is illustrated. The circuitry in FIG. 15 is adapted for converting optical signals to electrical signals, such as provided by the module in FIG. 7. The circuitry in FIG. 16 is adapted for converting electrical signals to optical signals, such as provided by the module in FIG. 6. It will be appreciated that a number of known configurations for achieving this function could be utilized.

Referring to FIG. 15, an optical signal is received by optical-to-electrical circuitry 300. An optical receiver 304 receives the optical signal and converts the optical signal to a single end electrical signal. This signal can be passed through or be regenerated (reclocked) by a Multi-Rate SDI (Serial Digital Interface) Automatic Reclocker module 306. If the signal bypasses the reclocker module, the embedded clock/video data of the signal is unchanged. If the signal passes to the reclocker module, the embedded clock of the signal will be recovered from the digital video signal and the incoming video data is re-timed from a SMPTE 292M, SMPT 259M or SMPTE 344M compliant digital video signal. The reclocker module's output signal is LVPECL compliant.

The signal then passes to three mulit-rate dual slew-rate cable drivers 310. The cable drivers 310 can drive data rates up to 1.485 Gb/second and provide two selectable slew rates to achieve compliance to SMPTE 292M, SMPT 259M or SMPTE 344M.

Referring now to FIG. 16, an electrical signals is received by electrical-to-optical circuitry 318. An electrical signal optical receiver circuit 320 converts the optical signal to a single end electrical signal. This signal can be passed through or be regenerated (reclocked) by a Multi-Rate SDI (Serial Digital Interface) Automatic Reclocker module 322. If the signal bypasses the reclocker module, the embedded clock/video data of the signal is unchanged. If the signal passes to the reclocker module, the embedded clock of the signal will be recovered from the digital video signal and the incoming video data is re-timed from a SMPTE 292M, SMPT 259M or SMPTE 344M compliant digital video signal. The reclocker module's output signal is LVPECL compliant.

The signal then passes to an optical transmitter 326 and two mulit-rate dual slew-rate cable drivers 328. The cable drivers 328 can drive one or two co-axial cables. The cable drivers 328 can drive data rates up to 1.485 Gb/second and provide two selectable slew rates to achieve compliance to SMPTE 292M, SMPT 259M or SMPTE 344M.

In each of the modules types, the printed circuit boards (i.e., 50) use 3.3 VDC supplied from the power supply 16. Each of the printed circuit boards are electrically connected to LEDs as indicated on FIGS. 15 and 16.

Referring back to FIGS. 6-9, in the illustrated embodiments, the I/O arrangements 56 of each of the conversion modules 20 include additional outputs 76, 78. The additional outputs 76, 78 can be used for monitoring feedback or local signal distribution, for example. The additional outputs 76, 78 are typically electrical signal output connectors, as the signals used for monitoring feedback or for local distribution are not transmitted long distances so as to require an optical conversion and output; although other types of additional output connectors can be used.

Referring to FIGS. 6 and 7, the printed circuit board 50 has a front end 66 and a back end 68. In the illustrated embodiments, the I/O arrangement 56 of each of the modules 20 is located at the rear end 68 of the printed circuit boards 50. A faceplate 114 is attached to the front end 66 of the printed circuit boards 50. The faceplate 114 includes various visual indicators, such as the LEDs shown in FIGS. 15 and 16. The LEDs inform the user of the operation or functional state of the module 20. For example, the faceplate 114 can include LEDs corresponding to operational power, particular data rates, signal quality/state, for example. When the conversion modules 20 are positioned within the chassis 12, the faceplates 114 of the modules 20 are located adjacent to the front 26 of the chassis 12 and the I/O arrangements 56 are located adjacent to the rear 28 of the chassis 12.

Referring now to FIGS. 8 and 9, the printed circuit board connector 54 of each of the conversion modules 20 is located forward of the I/O arrangement 56. In particular, a notch 58 is formed in the printed circuit board 50 adjacent to the back end 68 of the printed circuit board. The printed circuit board connector 54 is positioned within the notch 58 so as to mate with the power supply connector 60 (FIG. 17) when the module 20 is positioned within the chassis 12.

Referring still to FIGS. 8 and 9, the conversion modules 20 of the present disclosure also include a radius limiter 70 mounted to the printed circuit board 50. The radius limiter 70 is located on a first planar surface 76 of the printed circuit board 50 between the front end 66 and the back end 68. The radius limiter 70 can either be mounted to the surface 76 by adhesive or fasteners, or in an alternative embodiment, molded as an integral construction of the printed circuit board 50. In the illustrated embodiment, the radius limiter 70 is mounted to holes 170 formed in the printed circuit board by snap-fit type connections 168 (partially shown in FIGS. 6 and 7).

The radius limiter 70 includes a radius-limiting surface 78 having a radius that is greater than a minimum bend radius of fiber optic cable. The radius limiting surface 78 is contained within a housing or enclosure portion 80 of the radius limiter 70. The housing or enclosure portion 80 of the radius limiter 70 holds and encloses an excess portion of a cable 172 (shown in dashed line in FIG. 8). The cable 172 is interconnected between the input connector 72 and the output connector 74. The radius limiter is constructed to protect and store the excess portion of the cable 172, ensuring that the excess portion of the cable does not bend beyond a minimum bend radius.

The housing 80 of the radius limiter includes sidewalls 96 that project outward from the planar surface 76 of the printed circuit board 50. The sidewalls 96 extend around a substantial majority of the radius-limiting surface 78. In the illustrated embodiment, the radius-limiting surface 78 is a 360-degree construction. The housing 80 includes windows 98 located generally at equal intervals around the radius-limiting surface 78. The windows 98 permit a user to view the excess portion of the cable 172 contained and enclosed within the housing 80.

Preferably, the radius limiter 70 is pre-loaded or pre-assembled with the cable 172. The snap-fit type connections 168 are detachable from the printed circuit board 50, however, in the event the cable needs to be replaced or the excess portion of the cable needs to be accessed. As shown, the cable 172 is routed from the input connector 72 to a first opening or entry 140 in the housing 80 of the radius limiter, wrapped around the radius-limiting surface 78, and then routed through a second opening or exit 142 in the housing 80 toward the output connector 74. This design effectively stores excess cabling interconnected between the input and output connectors 72, 74 without the occurrence of damage due to excessive bending.

Referring back to FIGS. 6 and 7, each of the conversion modules 20 further includes a securing element, such as a pivoting latch 82 located adjacent to the front end 66 of the printed circuit board 50. The latch 82 is configured to secure the module 20 within one of the plurality of slot compartments 32 defined within the chassis 12.

In particular, the latch 82 pivots about a pin joint 84 between an open position and a closed position. When the latch 82 is closed or locked (FIGS. 6 and 7), a latching end 88 of the latch 82 pivots and engages tabs 94 (FIGS. 3 and 17) extending upward from the bottom wall 46 of the chassis 12. At the same time, fingers 90 formed on a lever portion 86 of the latch 82 engage a pin 92 formed on or attached to the printed circuit board 50. The fingers 90 engage the pin 92 to secure the latch 82 in the locked position. As can be understood, when the latch 82 is opened (not shown), the lever portion 86 of the latch 82 pivots outward from and forward of the printed circuit board 50, thereby disengaging the latching end 88 from the tabs 94 of the bottom wall 46 of the chassis 12 so that the module 20 can be easily removed.

Referring back to FIGS. 3 and 5, the CPU module 14 of the telecommunications arrangement 10 is similar in physical size and construction to the conversion modules 20. The CPU module 14, however, is in electrical communication with each of the power supply connectors 60, and thereby each of the conversion modules 20. The CPU module 14 functions as the controller of the overall arrangement.

The CPU module 14 is located within the chassis 12 adjacent to the first and second power supplies 16, 18. The combined space allotted for both the CPU module 14 and the first and second power supplies 16, 18 is centrally located, that is, the same number of conversion modules 20 are provided on each side of the combined space.

Referring back to FIG. 4, the telecommunications arrangement 10 of the present disclosure includes a back plane 34 located at the rear 28 of the chassis 12. The back plane 34 is separate from the conversion modules 20. The separate back plane 34 includes an arrangement of bulkhead connectors 36 that receive input and output cables (not shown). The back plane 34 preferably includes a plurality of individual back panels 40 that corresponds to the plurality of conversion modules 20. Providing a separate back plane 34 permits a user to remove and/or replace a particular module 20 without having to detach cables interconnected to that particular module 20. Providing individual back panels 40 permits a user to remove and/or replace a particular back panel without having to remove the entire back plane 34.

Similar to the modules 20, the arrangement of bulkhead connectors 36 of the back panels 40 includes either an electrical-to-optical arrangement 102 (FIGS. 10 and 11) or an optical-to-electrical arrangement 104 (FIGS. 12 and 13), depending upon the particular I/O arrangement 56 of the module 20 to which the back panel 40 attaches. In the illustrated embodiment of FIG. 4, the telecommunications arrangement 10 includes modules 20 and back panels 40 having both electrical-to-optical and optical-to-electrical arrangements (62, 64, 102, 104).

Each of the arrangements of bulkhead connectors 36 in FIGS. 10-13 includes a bulkhead input 106 and a primary bulkhead output 108. Depending upon the type of bulkhead arrangement 36, the bulkhead input and output 106, 108 can include an electrical bulkhead connector, such as a coaxial bulkhead connector; or an optical bulkhead connector, such as an SC optical bulkhead connector. Similar to the modules, the back panels 40 also include additional bulkhead outputs 110, 112 for monitoring feedback or for local distribution operation, for example. Each of the bulkhead inputs and outputs 106, 108, 110, 112 extends in a direction generally perpendicular to the back panel 40.

As can be understood, in each of the embodiments, the connection between the electrical and optical bulkhead connectors of the panels 40 and the input and output connectors of the I/O arrangement 56 of the modules 20 is a blind connection. Accordingly, at least the inner optical and electrical connectors of the bulkhead input and outputs that match up with I/O arrangement 56 are sliding type optical and electrical connectors.

Figure 5:
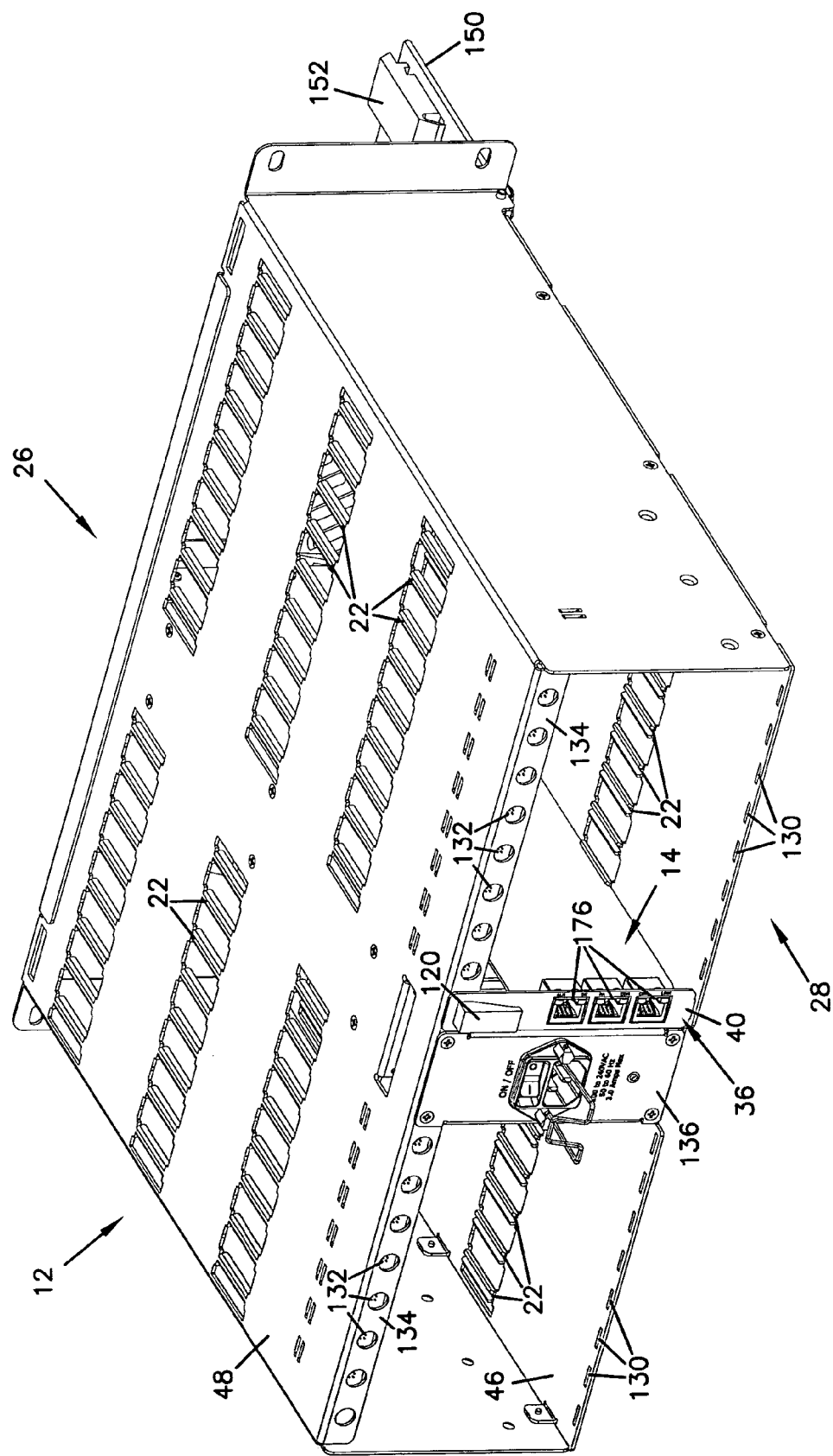
FIG. 5 is a rear perspective view of the chassis of FIG. 3.

Referring to FIG. 5, the back panel 40 for the CPU module 14 has a different connector arrangement 36 than that of the conversion modules 20. The connector arrangement 36 of the CPU module 14 includes three RJ-45 type connectors 176.

Referring again to FIGS. 10-13, each of the separate back panels 40 includes a securing element, such as a latch 120, for securing the back panel 40 to the rear 28 of the chassis 12. In the illustrated embodiment, the securing element is a swell latch 120 located adjacent to a top edge 116 of the panel 40. The swell latch 120 has a rubber portion 122 that expands or swells when a locking tab or lever 124 is positioned in a locked position. In conventional arrangement, fasteners are typically used to secure back panels or a back plane to a chassis.

Each of the back panels 40 also includes a tab 126 located along a bottom edge 128 of the back panel. The tab 126 projects outward from the bottom edge 128 in a direction generally parallel with the back panel 40. To install the back panel 40 to the rear 28 the chassis 12, the tab 126 is positioned within a slot 130 (FIG. 5) formed in the bottom wall 46 of the chassis 12. The slots 130 are located adjacent to the rear 28 of the chassis 12. The rubber portion 122 of the swell latch 120 is then inserted a hole 132 (FIG. 5) formed along a lip 134 of the top wall 48 of the chassis 12. As can be understood, the lever 124 of the latch 120 is in an upward, open position (not shown) when the rubber portion 122 is inserted into the hole 132. The lever 124 is then flipped downward into a closed or locked position (shown in FIGS. 10-13). In the locked position, the rubber portion 122 radially expands or swells. The swelled configuration of the rubber portion 122 prevents the portion 122 from being pulled out from the hole 132, thereby securing the back panel 40 to the rear 28 of the chassis 12.

The swell latches 120 of the back panels 40 are easy to use and thereby reduces time in assembly or replacement/maintenance of the back panels 40. The rubber locking construction of the swell latches also enhances the overall construction of the telecommunications arrangement 10 by dampening vibrations typically not dampened by traditional screw fasteners. Dampening vibrations reduces damage and wear associated with vibration, which can often be problematic in vehicle-mounted applications, for example.

Referring back to FIG. 1, the telecommunications arrangement 10 includes a door or front cover 150 that encloses the chassis 12. In the illustrated embodiment, the front cover is constructed of a Plexiglas material so that the visual indicators located on the faceplate 114 of the modules 20 can be monitored through the front cover; although, a cover made of another material can also be used.

Figure 1:
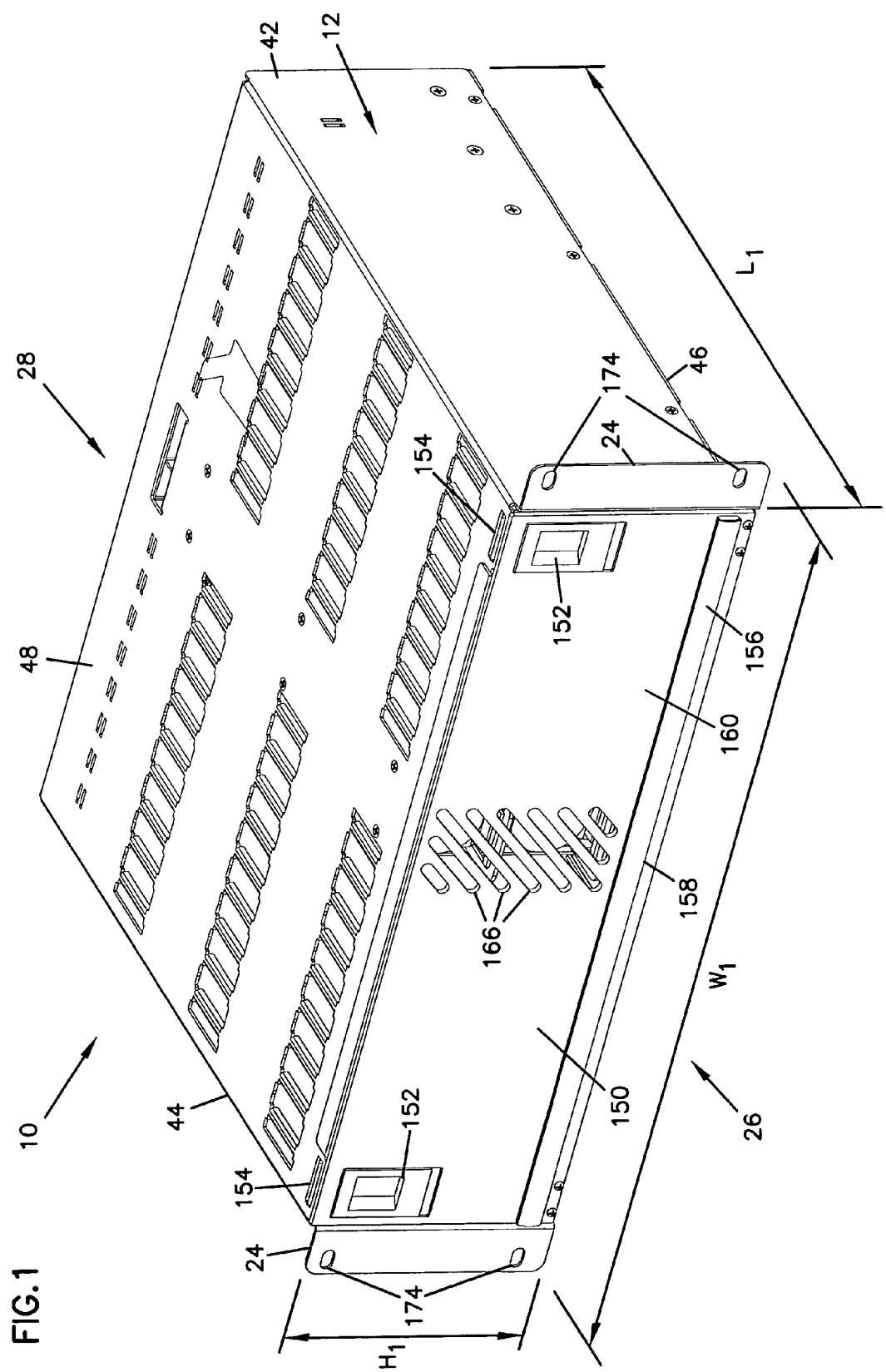
FIG. 1 is a front perspective view of a telecommunications arrangement, according to the principles of the present disclosure.

The front cover 150 preferably pivots or hinges from a closed position, shown in FIG. 1, to an open position, shown in FIG. 2. Cover latches 152 are provided to secure the cover in the closed position. The cover latches 152 engage slots 154 formed in the top wall 48 of the chassis 12 to secure the cover 150 in the closed position.

In the illustrated embodiment, a first designation strip 156 (FIG. 1) is located on an exterior side 160 of the front cover 150. The first designation strip 150 is positioned along a bottom edge 158 of the front cover 150, and below the faceplate 114 of the modules 20, which can be viewed through the Plexiglas cover. Referring to FIG. 2, preferably, a second designation strip (not shown) can be placed within a designation strip holder 164 located on an interior side 162 of the front cover 150. The first and second designation strips (e.g., 156) can be used for markings or indicia that correspond to the particular module 20 mounted directly above the markings or indicia.

Still referring to FIGS. 1 and 2, the front cover 150 also includes ventilation slots 166. Air is drawn through the ventilation slots 166 by power supply fans for cooling purposes.

Figure 14:
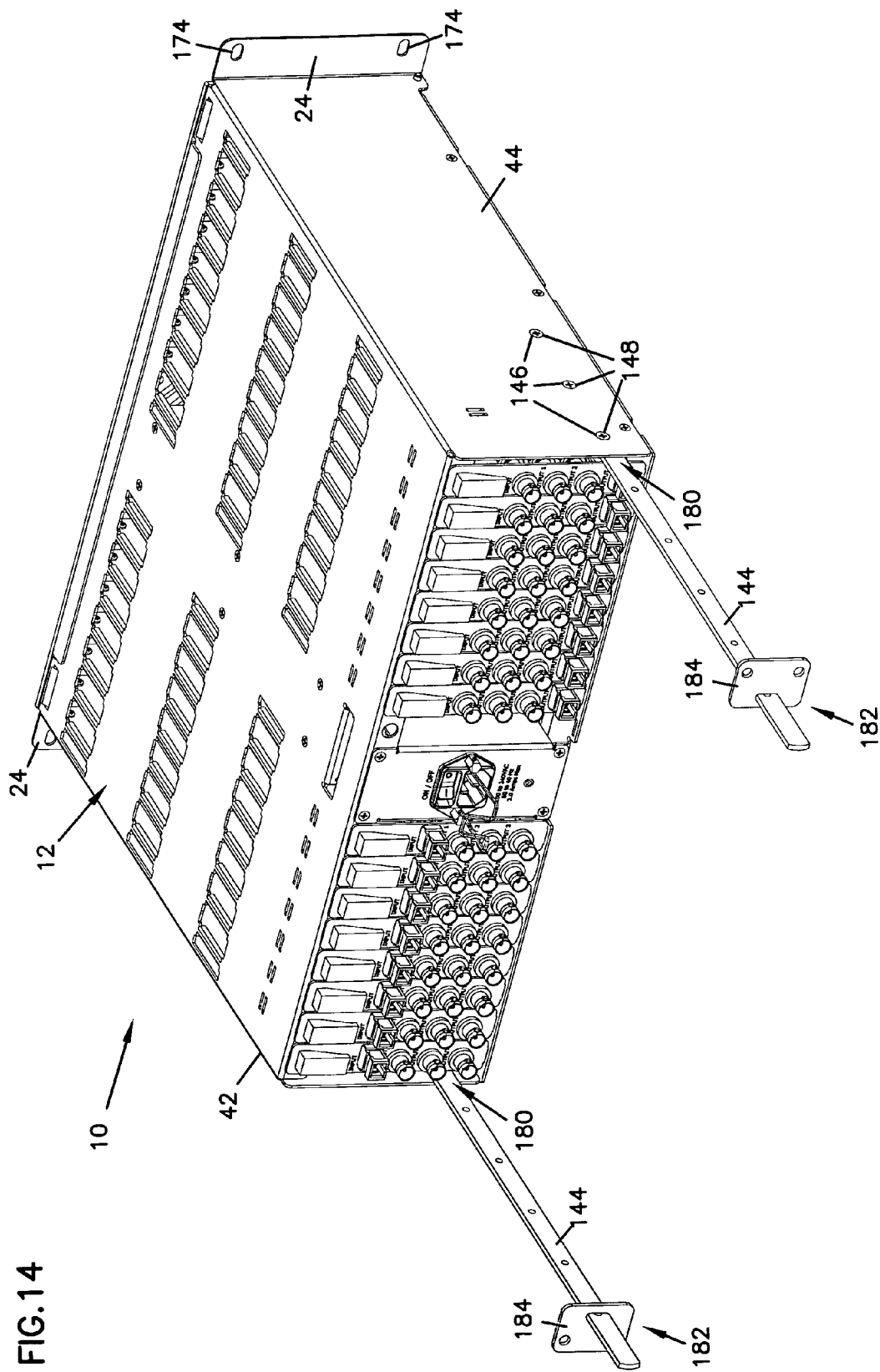
FIG. 14 is a rear perspective view of the telecommunications arrangement of FIG. 1, including mounting brackets.

Referring now to FIG. 14, the disclosed telecommunications arrangement 10 mounts to a wall via a mounting assembly (not shown). In particular, the mounting flanges 24 of the chassis 12 are used to attach the chassis 12 to the mounting assembly, which in turn, mounts to a wall. In some application, such as in vehicle-mounted applications, additional structural mounting stability is needed. The illustrated telecommunications arrangement 10 includes support brackets 144 that provide additional rigidity and stability to mounting assemblies experiencing greater vibration or dynamic loading. Each of the support brackets 144 includes a first end 180 and a second end 182 that mount to the chassis 12 and the wall. The first ends 180 of the brackets 144 attach to the sidewalls 42, 44 of the chassis 12. Holes 146 are provided in the sidewalls 42, 44 for receipt of fasteners 148 to secure the first ends 180 of the support brackets 144 to the chassis 12. The second ends 182 of the brackets 144 have flanges 184 that mount to the wall of a vehicle, for example.

The features of the disclosed telecommunications arrangement promotes cable management, ease of assembly and maintenance, and provides increased conversion capacity. The above specification provides a complete description of the present invention. Since many embodiments of the invention can be made without departing from the spirit and scope of the invention, certain aspects of the invention reside in the claims hereinafter appended.

What is claimed is:

1. A telecommunications arrangement, comprising:
   a) a chassis having front side and a rear side, the front side of the chassis defining a front opening;
   b) first and second power supplies positioned within the chassis, the first and second power supplies being vertically stacked relative to one another within the chassis; and
   c) a single row of upright conversion modules positioned within the front opening of the chassis, the first and second vertically stacked power supplies being located within the single row of upright conversion modules, each of the conversion modules including:
      i) a printed circuit board;
      ii) an input connector mounted to the printed circuit board for receiving an incoming signal, and at least one output connector mounted to the printed circuit board for transmitting an outgoing signal; and
      iii) circuitry for converting either an incoming electrical signal to an outgoing optical signal, or an incoming optical signal to an outgoing electrical signal;
   d) wherein a first number of conversion modules in the single row are laterally located on one side of the stacked power supplies, and a second number of conversion modules in the single row are laterally located on the other side of the stacked power supplies.

2. The arrangement of claim 1, wherein the first and second power supplies are generally centrally located within the chassis.

3. The arrangement of claim 1, wherein eight conversion modules are located on both sides of the stacked power supplies.

4. The arrangement of claim 1, further including a CPU module positioned within the front opening of the chassis, the CPU module being in electrical communication with the conversion modules.

5. The arrangement of claim 4, wherein the CPU module is centrally located within the chassis adjacent to the power supply.

6. The arrangement of claim 1, wherein each of the modules further includes a latch to secure the module within one of a plurality of compartments defined within the chassis.

7. The arrangement of claim 1, further including a back plane located at the rear side of the chassis, the back plane including bulkhead connectors that couple to input and output cables.

8. The arrangement of claim 7, wherein the back plane is separate from the conversion modules.

9. The arrangement of claim 8, wherein the back plane includes a plurality of individual back panels, each back plane corresponding to one of the conversion modules.

10. The arrangement of claim 9, wherein each of the separate back panels includes a latch for securing the back panel to the rear side of the chassis.

11. The arrangement of claim 10, wherein the latch for securing the back panel to the rear side of the chassis is a swell latch.

12. The arrangement of claim 1, wherein each of the conversion modules includes a radius limiter mounted on a surface of the printed circuit board, the radius limiter including an enclosed radius limiting surface for holding excess cable interconnected between the input connector and the output connector.

13. The arrangement of claim 1, further including a plurality of power supply connectors located within the chassis adjacent to the rear side of the chassis, each of the power supply connectors being in electrical communication with the first and second power supplies.

14. The arrangement of claim 13, wherein each of the conversion modules includes a connector that couples to one of the plurality of power supply connectors, the connector being located forward of the input connector and the output connector, and adjacent to the back end of the printed circuit board.

15. The arrangement of claim 14, wherein the connector that couples to one of the plurality of power supply connectors is located in a notch formed in the printed circuit board.

16. The arrangement of claim 1, wherein the chassis has a width of about 19 inches.

17. The arrangement of claim 12, wherein the radius limiter has a housing portion that defines an entrance opening and an exit opening.

18. The arrangement of claim 17, wherein the housing portion includes sidewalls that project outward from the surface of the printed circuit board.

19. The arrangement of claim 18, wherein the sidewalls of the housing portion extend around a substantial majority of the radius limiting surface.

20. The arrangement of claim 17, wherein the housing portion includes windows for viewing the excess cable held by the radius limiter.

21. The arrangement of claim 1, wherein the chassis includes a top wall and a bottom wall, the arrangement further including:
   a) card guides located within the chassis that at least partially define compartments sized to receive the conversion modules; and
   b) a plurality of individual back panels corresponding to the number of card guides, the back panels being mounted to the rear side of the chassis, each of the back panels including:
      i) a bulkhead input and a bulkhead output;
      ii) a tab extending from a bottom edge of the back panel, the tab being sized to fit within a slot formed in the bottom wall of the chassis; and
      iii) a swell latch located adjacent to a top edge of the back panel, the swell latch being arranged to engage a hole formed in the top wall of the chassis.

22. The arrangement of claim 7, wherein the bulkhead connectors include an optical bulkhead input and an electrical bulkhead output.

23. The arrangement of claim 7, wherein the bulkhead connectors include an electrical bulkhead input and an optical bulkhead output.

24. The arrangement of claim 11, wherein each of the separate back panels has a top edge and a bottom edge, the swell latch being located adjacent to the top edge, each of the back panels further including a tab located at the bottom edge of the back panel.

25. The arrangement of claim 24, wherein the bulkhead connectors are arranged in a vertical array between the swell latch and the tab.

\* \* \* \* \*